United States Patent
King et al.

(10) Patent No.: US 7,453,129 B2
(45) Date of Patent: Nov. 18, 2008

(54) IMAGE SENSOR COMPRISING ISOLATED GERMANIUM PHOTODETECTORS INTEGRATED WITH A SILICON SUBSTRATE AND SILICON CIRCUITRY

(75) Inventors: Clifford Alan King, New York, NY (US); Conor S. Rafferty, New York, NY (US)

(73) Assignee: Noble Peak Vision Corp., Wakefield, MA (US)

( * ) Notice: Subject to any disclaimer, the term of this patent is extended or adjusted under 35 U.S.C. 154(b) by 320 days.

(21) Appl. No.: 10/964,057

(22) Filed: Oct. 13, 2004

(65) Prior Publication Data

US 2005/0205954 A1    Sep. 22, 2005

Related U.S. Application Data

(63) Continuation-in-part of application No. 10/453,037, filed on Jun. 3, 2003, now Pat. No. 7,012,314.

(60) Provisional application No. 60/434,359, filed on Dec. 18, 2002, provisional application No. 60/510,932, filed on Oct. 13, 2003.

(51) Int. Cl.
H01L 27/14 (2006.01)
H01L 29/82 (2006.01)
H01L 29/84 (2006.01)

(52) U.S. Cl. .................. 257/414; 257/431; 257/432; 257/417; 257/E33.076; 257/E31.115

(58) Field of Classification Search .............. 257/226, 257/234, 417, 427, 440, 444, 470, 414, 431, 257/432, 428, 233, 227, 292, 293, E33.076, 257/E31.115
See application file for complete search history.

(56) References Cited

U.S. PATENT DOCUMENTS 3,971,065 A    7/1976   Bayer ..................... 358/41

(Continued)

FOREIGN PATENT DOCUMENTS

EP         0538886 A1    4/1993

(Continued)

OTHER PUBLICATIONS

S. Nakamura et al., *inGaN* . . . , Jpn., J. Appl. Phys., vol. 36, Pt. 2, No. 12A, pp. L1568-1571 (Dec. 1997).

(Continued)

*Primary Examiner*—Phuc T Dang
*Assistant Examiner*—Thanh Y Tran
(74) *Attorney, Agent, or Firm*—Wolf, Greenfield & Sacks, P.C.

(57) ABSTRACT

In accordance with the invention, an improved image sensor comprises an array of germanium photosensitive elements integrated with a silicon substrate and integrated with silicon readout circuits. The silicon transistors are formed first on a silicon substrate, using well known silicon wafer fabrication techniques. The germanium elements are subsequently formed overlying the silicon by epitaxial growth. The germanium elements are advantageously grown within surface openings of a dielectric cladding. Wafer fabrication techniques are applied to the elements to form isolated germanium photodiodes. Since temperatures needed for germanium processing are lower than those for silicon processing, the formation of the germanium devices need not affect the previously formed silicon devices. Insulating and metallic layers are then deposited and patterned to interconnect the silicon devices and to connect the germanium devices to the silicon circuits. The germanium elements are thus integrated to the silicon by epitaxial growth and integrated to the silicon circuitry by common metal layers.

18 Claims, 8 Drawing Sheets

U.S. PATENT DOCUMENTS

| | | | |
|---|---|---|---|
| 4,011,016 A | 3/1977 | Layne et al. ............... 356/195 |
| 4,038,680 A | 7/1977 | Yagi et al. |
| 4,238,760 A | 12/1980 | Carr .......................... 357/30 |
| 4,309,604 A | 1/1982 | Yoshikawa et al. .......... 250/226 |
| 4,613,895 A | 9/1986 | Burkey et al. ............... 358/41 |
| 4,651,001 A | 3/1987 | Harada et al. ............... 250/330 |
| 4,677,289 A | 6/1987 | Nozaki et al. ............... 250/226 |
| 4,952,526 A | 8/1990 | Pribat et al. |
| 5,120,666 A | 6/1992 | Gotou |
| 5,158,907 A | 10/1992 | Fitzgerald, Jr. |
| 5,221,413 A | 6/1993 | Brasen et al. ............... 156/613 |
| 5,285,086 A | 2/1994 | Fitzgerald, Jr. |
| 5,308,980 A | 5/1994 | Barton .................... 250/338.4 |
| 5,326,721 A | 7/1994 | Summerfelt ................. 437/131 |
| 5,371,033 A | 12/1994 | Lee et al. ...................... 437/53 |
| 5,442,205 A | 8/1995 | Brasen et al. ............... 257/191 |
| 5,447,117 A * | 9/1995 | Yonehara et al. ............... 117/7 |
| 5,467,204 A | 11/1995 | Hatano et al. |
| 5,502,299 A | 3/1996 | Standley .................. 250/208.2 |
| 5,668,596 A | 9/1997 | Vogel ......................... 348/222 |
| 5,739,562 A | 4/1998 | Ackland et al. ............. 257/291 |
| 5,883,421 A | 3/1999 | Ben Chouikha et al. ..... 257/461 |
| 5,965,875 A | 10/1999 | Merrill ....................... 250/226 |
| 6,287,903 B1 | 9/2001 | Okuno et al. |
| 6,352,942 B1 * | 3/2002 | Luan et al. ................... 438/770 |
| 6,396,046 B1 | 5/2002 | Possin et al. ............. 250/208.1 |
| 6,410,941 B1 | 6/2002 | Taylor et al. ................... 257/84 |
| 6,455,360 B1 | 9/2002 | Miyasaka |
| 6,477,285 B1 | 11/2002 | Shanley ......................... 385/14 |
| 6,576,532 B1 | 6/2003 | Jones et al. ................. 438/481 |
| 6,677,655 B2 | 1/2004 | Fitzergald ................... 257/432 |
| 6,680,495 B2 | 1/2004 | Fitzergald ................... 257/183 |
| 6,864,111 B2 | 3/2005 | Yu et al. ........................ 438/22 |
| 6,864,557 B2 | 3/2005 | Turner et al. ................ 257/440 |
| 6,868,138 B2 | 3/2005 | Clinthorne et al. ......... 378/98.8 |
| 6,900,499 B2 | 5/2005 | Yamazaki et al. |
| 2001/0052597 A1 | 12/2001 | Young et al. .................. 257/59 |
| 2002/0011640 A1 | 1/2002 | Bauer et al. ................. 257/443 |
| 2002/0039833 A1 * | 4/2002 | Bensahel et al. ............ 438/503 |
| 2002/0072140 A1 | 6/2002 | Finder et al. ................. 438/30 |
| 2002/0135034 A1 | 9/2002 | Shigenaka et al. .......... 257/440 |
| 2002/0163023 A1 | 11/2002 | Milda ........................ 257/292 |
| 2002/0181825 A1 | 12/2002 | Johnson et al. ............... 385/14 |
| 2003/0010988 A1 | 1/2003 | Franson ........................ 257/88 |
| 2003/0010992 A1 | 1/2003 | Lempkowski et al. ......... 257/98 |
| 2003/0013218 A1 * | 1/2003 | Chason ......................... 438/27 |
| 2003/0015722 A1 | 1/2003 | Chason et al. ............... 257/103 |
| 2003/0016311 A1 | 1/2003 | Sato et al. ..................... 349/43 |
| 2003/0020078 A1 | 1/2003 | Klosowiak et al. ............ 257/83 |
| 2003/0102469 A1 * | 6/2003 | Jones et al. ..................... 257/9 |
| 2003/0103150 A1 | 6/2003 | Catrysse et al. ............. 348/272 |
| 2003/0148565 A1 * | 8/2003 | Yamanaka ................. 438/200 |
| 2003/0148570 A1 | 8/2003 | Rhodes |
| 2003/0205710 A1 | 11/2003 | Gardner et al. ................ 257/79 |
| 2004/0012029 A1 | 1/2004 | Bawolek et al. ............... 257/98 |
| 2004/0029325 A1 | 2/2004 | Le Goascoz et al. |
| 2004/0079971 A1 | 4/2004 | Taylor ........................ 257/215 |
| 2004/0222463 A1 | 11/2004 | Yeo et al. |

FOREIGN PATENT DOCUMENTS

| | | |
|---|---|---|
| EP | 0951055 A2 | 10/1999 |
| EP | 0967656 A2 | 12/1999 |
| EP | 1005058 A2 | 5/2000 |
| JP | 2000340783 | 12/2000 |
| JP | 2001267544 | 9/2001 |
| WO | WO 99/44224 | 9/1999 |
| WO | WO 02/090625 A1 | 11/2002 |
| WO | WO 2004/061911 A2 | 7/2004 |

OTHER PUBLICATIONS

M.T. Currie et al., *Controlling threading* . . . , Appl. Phys. Lett., vol. 72, No. 14, pp. 1718-1720 (Apr. 1998).

H-C. Luan et al., *High-Quality Ge* . . . , Appl. Phys. Lett., vol. 75, No. 19, pp. 2909-2911 (Nov. 1999).

G. Masini et al., *High responsivity* . . . , Electr. Lett., vol. 35, No. 17, pp. 1467-1468 (Aug. 1999).

G. Masini et al., *High-Performance* . . . , IEEE Trans. on Electr. Dev., vol. 48, No. 6, pp. 1092-1096 (Jun. 2001).

L. Colace et al., *Efficient high speed* . . . , Appl. Phys. Lett., vol. 76, No. 10, pp. 1231-1233 (Mar. 2000).

L. Colace et al., *Metal-semiconductor* . . . , Appl. Phys. Lett., vol. 72, No. 24, pp. 3175-3177 (Jun. 1998).

T.A. Langdo et al., *High quality Ge on Si* . . . , Appl. Phys. Lett., vol. 76, No. 25, pp. 3700-3702 (Jun. 2000).

O-H. Nam et al., *Lateral epitaxy* . . . , Appl. Phys. Lett., vol. 71, No. 18, pp. 2638-2640 (Nov. 1997).

J.D. Schaub et al., *Resonant-cavity* . . . , IEEE Photonic Tech. Lett., vol. 11, No. 12, pp. 1647-1649 (Dec. 1999).

H.C. Lee et al., *A Novel High-Speed* . . . , IEEE Electr. Dev. Lett., vol. 16, No. 5, pp. 175-177 (May 1995).

S.B. Samavedam et al., *High-quality germanium* . . . , Appl. Phys. Lett., vol. 73, No. 15, pp. 2125-2127 (Oct. 1998).

Hewitt, M.J., et al., "Infrared readout electronics: a historical perspective," Infrared Readout Electronics II, SPIE, vol. 2226, pp. 108-119 (1994).

Loinaz, M., et al., "A 200-mW, 3.3-V, CMOS Color Camera IC Producing 352 x 288 24-b Video at 30 Frames/s," IEEE J. Solid-State Circuits, vol. 33, No. 12, pp. 2092-2103 (1998).

Moore, A.C., et al., "Interpixel capacitance in non-destructive focal plane arrays," Proc. Of SPIE, Focal Plane Arrays for Space Telescopes, vol. 5167, pp. 204-215 (2003).

Gamal, A., "Trends in CMOS Image Sensor Technology and Design," IEDM Tech. Digest, pp. 805-808 (2002).

Foreign Office Communication mailed Apr. 2, 2007.

International Search Report mailed Feb. 12, 2008 from the International Searching Authority for International Application No. PCT/US 06/32272.

Written Opinion mailed Feb. 12, 2008 from the International Searching Authority for International Application No. PCT/US 06/32272.

English translation of Office Action dated Aug. 10, 2007 from Chinese Patent Office regarding Chinese Application for Invention No. 200480033261.8.

* cited by examiner

IMAGE SENSOR COMPRISING ISOLATED GERMANIUM PHOTODETECTORS INTEGRATED WITH A SILICON SUBSTRATE AND SILICON CIRCUITRY

CROSS REFERENCES TO RELATED APPLICATIONS

This application claims the benefit of U.S. Provisional Application Ser. No. 60/510,932 filed by C. A. King and C. S. Rafferty on Oct. 13, 2003 entitled "Method to Fabricate an Integrated Image Sensor Using Isolated Germanium Photodetectors", which application is incorporated herein by reference.

This application is also a continuation-in-part of U.S. patent application Ser. No. 10/453,037 filed by J. Bude, et al. on Jun. 3, 2003 now U.S. Pat. No. 7,012,314 and entitled "Semiconductor Devices With Reduced Active Region Defects and Unique Contacting Schemes." The '037 application, in turn, claims the benefit of U.S. Provisional Application Ser. No. 60/434,359 filed Dec. 18, 2002. The foregoing application Ser. No. 10/453,037 and 60/434,359 are incorporated herein by reference.

FIELD OF THE INVENTION

This invention relates to image sensing devices and, in particular, to an image sensing device comprising an array of germanium photodetectors integrated with a silicon substrate and silicon circuitry. The devices are particularly useful for sensing images in infrared light.

BACKGROUND OF THE INVENTION

Image sensors capable of sensing images in infrared light, especially short wave infrared light, are important in a wide variety of applications including optical communications (both fiber and free space), laser detecting and ranging (LADAR), ice detection (as on roads and aircraft), and pharmaceutical manufacturing. Such sensors are also used in art conservation, detection of tumors, astronomy, imaging through smoke and clouds, pollution detection, infrared microscopy, infrared spectroscopy and integrated circuit fabrication. Infrared image sensors are the heart of equipment for night vision and for three dimensional laser detection and ranging (3-D LADAR).

A typical image sensor comprises a two-dimensional array of photodetectors (called a focal plane array) in combination with a readout integrated circuit (ROIC). The photodetectors are sensitive to incoming radiation. The ROIC quantitatively evaluates the outputs from the photodetectors and processes them into an image.

Focal plane arrays (FPAs) have evolved since the 1970's from systems that required cooling to near absolute zero to systems that, depending on wavelength, can operate near room temperature. See Reference 1 in the attached list of References Cited (hereinafter [1]). This relaxation in the cooling requirements has allowed much smaller, reliable, and inexpensive systems for infrared imaging and has permitted a multitude of new applications.

The increase in operating temperature is due to the use of new materials in the detectors. Early arrays used doped silicon as the detector material (e.g. extrinsic silicon doped with a shallow level impurity such as As, In, or Ga). They relied on the ionization of the shallow level impurity by the incoming infrared photons to detect the presence of radiation. Today's photodectors use compound semiconductor materials such as InGaAs, InSb, and HgCdTe or silicides such as PtSi. The resulting detectors can operate at much higher temperatures.

Unfortunately, the process technology for the newer detector materials is incompatible with the technology to process the silicon readout electronics. Consequently two separate chips are required to form a hybridized image sensor. The two chips are typically joined together by affixing indium bumps on the detectors and on the appropriate nodes of the readout integrated circuit (ROIC). With the indium bumps in place, the two chips are aligned and bonded together.

While the indium bump bonding process has enabled new applications at higher temperatures, the bonding process presents problems with reliability, processing, size and speed. Reliability of the bonds is a major concern. Thermal expansion mismatch, high g forces, and vibration all can cause the bonds to fail. Thermal mismatch between the detector material and the silicon ROIC is a particular problem because cooling of the image sensor is required for many applications to reduce the detector dark current. Barton [2] teaches a method employing a third substrate material to lessen the thermal mismatch problem, but the third material adds complexity and increases cost. High g forces that can cause bump bonding failures are often encountered by image sensor devices employed in space applications, and in all applications moderate vibration of the hybridized image sensor can cause individual detectors (pixels) to fail. These limitations are extremely detrimental given the harsh field environments these devices are likely to experience.

The added steps of bonding also increase cost and reduce yield. Since the detector arrays are typically illuminated from the backside, the arrays are usually very thin. Thinned arrays are difficult to handle during assembly, and this difficulty adds to the yield problems accompanying indium bump bonding.

Indium bump bonds also limit reduction in the size of individual pixels. Indium bump bonds are relatively large (approximately 10 µm diameter). The smallest pixel size of FPAs using indium bumps is about $25 \times 25$ µm$^2$. This contrasts with the much smaller pixel size of Si image sensors (approaching $2 \times 2$ µm$^2$). Since larger array size limits the image resolution, and larger FPA dimensions increase the size of the optics required to fully illuminate the array, bump bonding is disadvantageous in applications where camera weight and volume are critical.

Indium bump bonds further limit the speed of image sensors needed for applications such as 3-D LADAR imaging. Indium bump bonds present an additional capacitive load that slows down the detection and readout electronics. In addition, the bonds increase the power consumption and increase the pixel-to-pixel capacitance thereby increasing the array noise and complicating noise analysis [4]. Accordingly there is a need for a more easily fabricated image sensor, especially a reliable, compact sensor that can detect short wave infrared at high speed with small pixel size.

SUMMARY OF THE INVENTION

In accordance with the invention, an improved image sensor comprises an array of germanium photosensitive elements integrated with a silicon substrate and integrated with silicon readout circuits. The silicon transistors are formed first on a silicon substrate, using well known silicon wafer fabrication techniques. The germanium elements are subsequently formed overlying the silicon by epitaxial growth. The germanium elements are advantageously grown within surface openings of a dielectric cladding. Wafer fabrication techniques are applied to the elements to form isolated germanium photodiodes. Since temperatures needed for germanium processing are lower than those for silicon processing, the formation of the germanium devices need not affect the previously formed silicon devices. Insulating and metallic layers are then deposited and patterned to interconnect the silicon devices and to connect the germanium devices to the silicon circuits. The germanium elements are thus integrated to the silicon by epitaxial growth and integrated to the silicon circuitry by common metal layers.

At each picture element, or pixel, the germanium element converts the incoming illumination into an electrical signal. Silicon circuitry at the pixel detects and amplifies the signal from the germanium element. The pixels are read, as by row and column addressing circuitry, to read out and uniquely identify the output of each pixel. Thus an image is read out from the array. Since germanium is photosensitive from the visible through the infrared up to wavelengths of about 1.7 μm, both visible and infrared images may be formed. The signal from each pixel is converted from an analog current or voltage to a digital value before being transmitted off-chip. This minimizes signal degradation. In a preferred embodiment, each germanium pixel is epitaxially grown on the silicon as a small crystalline island in a dielectric surface cladding.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION OF THE INVENTION

Figure 1:
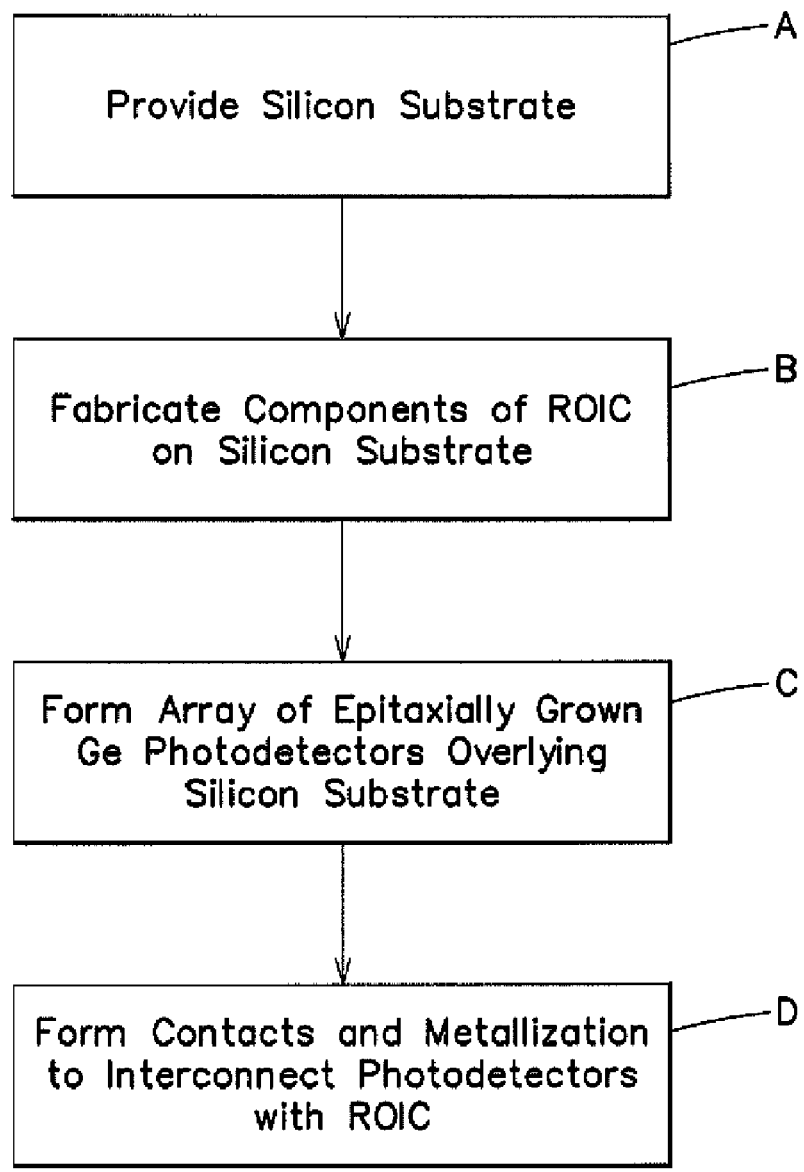
FIG. 1 is a schematic flow diagram of the steps involved in fabricating an improved image sensor in accordance with one embodiment of the invention.
Figure 2A:
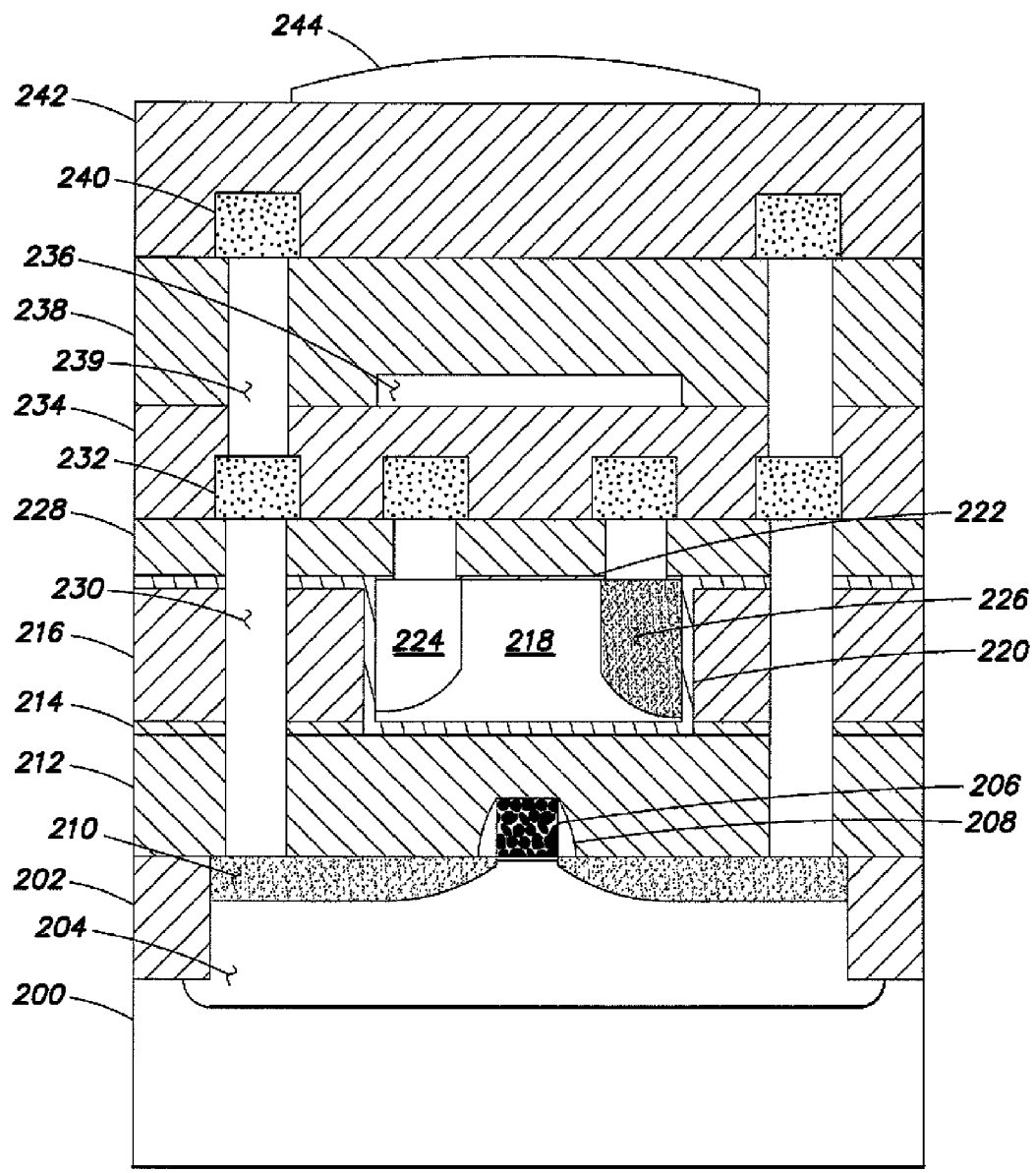
FIG. 2A is a cross section view showing the relative position of the Ge layer with respect to the layers of the silicon circuit.
Figure 2B:
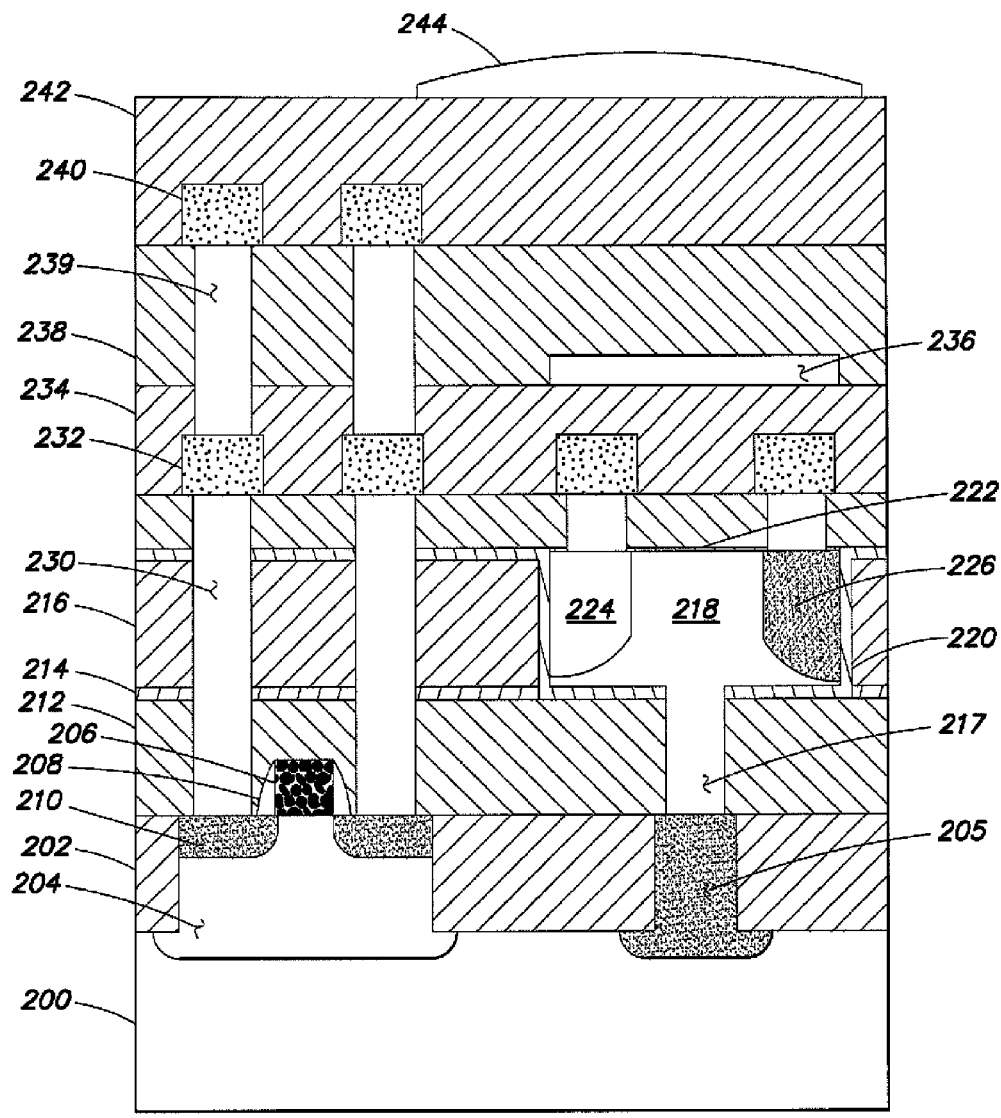
FIG. 2B is another cross section view showing the relative position of the Ge layer.

Referring to the drawings, FIG. 1 is a schematic flow diagram of a preferred method of fabricating an image sensor. The method will also be described by reference to FIGS. 2A and 2B. FIG. 2A displays the final device structure through metallization and the inclusion of a microlens on each pixel, and FIG. 2B displays the cross section of the device including a Ge seed layer.

As shown in Block A of FIG. 1, the first step in the fabrication process is to provide a substrate comprising silicon. The silicon is selected or chosen to have the resistivity and crystal orientation appropriate for the chosen silicon device processing technology, usually CMOS or BiCMOS processing.

The next step (Block B) is to fabricate components of the silicon readout integrated circuitry (ROIC) in the silicon substrate in accordance with the chosen silicon processing technique.

Referring to FIG. 2A, an exemplary fabrication begins with a silicon substrate 200. A shallow trench isolation 202 is formed, followed by a transistor well 204. A gate stack 206 consisting of a thin insulating layer and a layer of conducting gate material is deposited or grown and patterned. Spacers 208 are then deposited and etched using anisotropic etching. After spacer formation, source and drain regions 210 are formed through implantation or other means such as selective epitaxy and annealed if necessary. The source/drain annealing is usually the final high temperature process (900-1050° C. for 1-30 s). Once the sources and drains are completed, the thermal budget must be limited to avoid solid state diffusion. The first dielectric 212 is then formed in a conventional manner using a low temperature (350-750° C.) deposition process and planarized as by chemical mechanical polishing (CMP). The dielectric 212 can be silicon oxide, silicon oxynitride, or any similarly low dielectric constant material.

The third step (Block C of FIG. 1) is to form an array of epitaxially grown photodetectors comprising germanium overlying the silicon. Preferably the germanium photodetectors are formed from an array of small isolated germanium islands epitaxially grown within openings on a dielectric clad surface of the substrate. The growth and dimensions of the islands are chosen to provide low defect growth. As a result, the germanium photodetectors are monolithically integrated with the silicon circuitry.

An advantageous process for forming the islands with low defect growth is described in U.S. patent application Ser. No. 10/453,037 filed by Bude et al. on Jun. 3, 2003 which is incorporated herein by reference. The process involves the following steps:

(a) forming a dielectric cladding region on a major surface of the silicon substrate;

(b) forming first openings that extend to a first depth within the cladding region;

(c) forming a smaller second opening within each first opening, that extends to a second depth greater than the first depth and exposes the silicon;

(d) epitaxially growing regions of a material comprising germanium on the silicon in each of the openings and on top of each cladding region;

(e) controlling the dimensions of the second openings so that defects tend to be confined to the first epitaxial region grown within the second openings and to epitaxial regions overgrown on top of the cladding region, a first predetermined region being located within the first opening and being essentially free of defects; and (f) planarizing the top of the device to remove epitaxially overgrown regions that extend above the top of the cladding layer, thereby making the top of the first predetermined region grown in the second opening essentially flush with the top of the cladding region.

As an example, in a preferred method of forming the germanium photodetectors, a standard core silicon process is interrupted to include growth of a Ge absorption layer. Referring to FIG. 2A, a thin silicon nitride layer 214 that will act as an etch stop later in the process is deposited. Next, a dielectric 216 (this dielectric could be the same or different material to that used for 212) is deposited on the surface 214 to a thickness corresponding to the required thickness of the Ge absorption layer. The optimum thickness will depend on the wavelength of light to be detected. For example, at a wavelength of 1.3 μm, the lowest noise equivalent power is obtained at approximately 1.3 μm. At 1.55 μm wavelength, the optimum Ge thickness is about 2.3 μm. For typical applications, the Ge thickness, at minimum, should be sufficient to absorb at least 1% of the incident light in the wavelength range 400 to 1700 nm. With the dielectric cladding stack composed of 212, 214, and 216 in place, the well region 218 is formed by patterning the surface with resist and etching dielectric 216 using a plasma etch that is selective to dielectric 216 over nitride 214 [5]. The remainder of nitride 214 can be etched away using a solution of hot phosphoric acid or by a carefully timed plasma etch. In order to isolate the nitride 214, oxide 220 is formed through conformal deposition. Then the seed window 217 is formed by patterning the exposed portion of dielectric 212 and etching to the silicon substrate. Undoped Ge selective epitaxial growth (SEG) is then performed to fill the seed channel 217 and the Ge well 218. The background doping during epitaxy should be restricted as much as possible by taking precautions well known in the art of epitaxy. Chemical-mechanical polishing (CMP) is then used to planarize the resulting Ge growth to form a Ge region 218 that is flush with the surrounding dielectric 216.

To reduce the surface recombination velocity, a thin selective silicon layer 222 is then grown on the surface of 218 and partially oxidized. A p-i-n photodetector can then be made by implanting p-type dopant (e.g. boron) to form contact region 224 and by implanting n-type dopant (e.g. phosphorous) to form contact region 226. High energy implants capable of extending a substantial distance into the Ge well are desired for a high speed p-i-n device. Dielectric 228 is then deposited on the structure.

Although the absorption layer described above is germanium, it should be realized that one could equally well use an alloy of silicon and germanium, $(Si_{1-x}Ge_x)$ where x is varied from 0 to 100 percent. In that case, there would be a trade-off between the cutoff wavelength and the dark current. As the Ge fraction x is decreased, the dark current becomes lower and the cutoff wavelength becomes smaller.

Although a lateral p-i-n device structure is described above, it should be realized that alternative devices such as vertical p-i-n photodiodes, avalanche photodiodes, Geigermode photodiodes, phototransistors and other devices known in the art could be formed in the Ge layer to convert infrared light to an electrical signal.

The next step, shown as Block D of FIG. 1, is to form contacts and metallization to interconnect the Ge photodetectors with the silicon ROIC circuit. After the deposition of dielectric 228, vias 230 that contact the source/drains (or emitter, base, and collector of bipolar devices) of the transistors and the anode and cathode of the photodetector are etched from the surface through all the dielectric materials. The stack of dielectric materials includes dielectric 214 that may behave differently in the etching plasma. The remainder of the process, which includes backend metallization steps, proceeds as usual with two notable exceptions to be detailed later. After the vias are etched, they are filled with a conducting metal such as tungsten and then polished in the usual manner. Succeeding dielectric and metal layers are formed using standard processes.

The usual backend process can be modified to include a filter for a specific wavelength or band of wavelengths. A filter material 236 capable of filtering specific wavelengths can be deposited and patterned above the photodetector after planarizing one of the interlevel dielectric layers. Alternatively, the backend metal lines themselves can be patterned appropriately to be used as a filter for visible and infrared radiation incident on each of the pixel sensors [6]. Finally, a microlens 244 can be deposited, patterned, and flowed above each pixel to improve the effective fill factor of each pixel element.

Although we describe forming the Ge layer by selective epitaxial growth, it should be realized that the layer can be formed by other methods such as solid phase epitaxy, hydrogen implantation and wafer bonding, liquid phase epitaxy, and other techniques known in the art.

Figure 3:
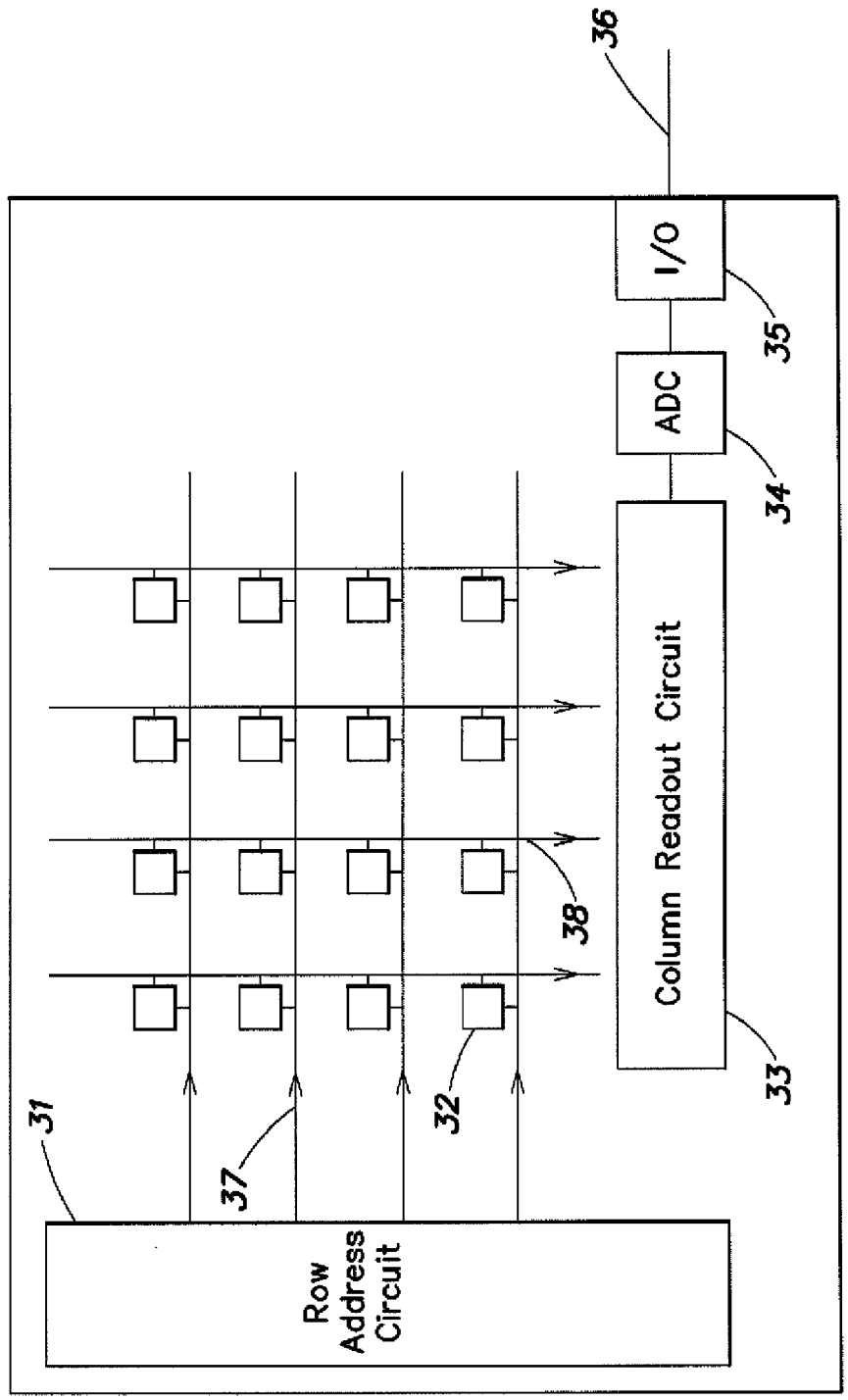
FIG. 3 shows an individually addressable pixel array wherein selection of a particular row address circuit and a particular column readout circuit uniquely identifies the light intensity at a given pixel.

FIG. 3 is a block diagram of the exemplary imager. The imager 30 comprises a row address circuit 31, an array of pixels 32, each containing a germanium photodetection layer, a column readout circuit 33, an analog-to-digital converter (ADC) 34 and output buffer 35 which the drives the chip output 36. There are also clocks and control logic, not shown in the figure. The row addressing circuit 31 selects one of a plurality of row address lines 37. Each row address line is connected to a plurality of pixels 32, one for each of the columns of the array. All the pixels in a given row are selected simultaneously by the row address line. Each pixel 32 in the selected row charges its column bus 38 to a voltage related to the accumulated illumination which that pixel has received since the last time it was reset. Only one row at a time is selected, so that the other pixels in the same column connected to the same column bus do not influence the voltage on the column bus. The combination of row address and selected column uniquely identify each pixel. By successively addressing each row in turn, and successively sampling and holding each column bus while each row is selected, the light intensity at each pixel of the array is detected, and an image may be formed. The analog voltage from the column buffers is converted to digital form by the analog-to-digital converter 34 and sent to the output buffer 35 before leaving the chip on the output bus 36. It will be appreciated by one skilled in the art that other patterns of pixels might also be used, such as a hexagonal grid of pixels, a checkerboard pattern of pixels, or, for some applications, even a single line of pixels, without departing from the scope of the invention.

Figure 4A:
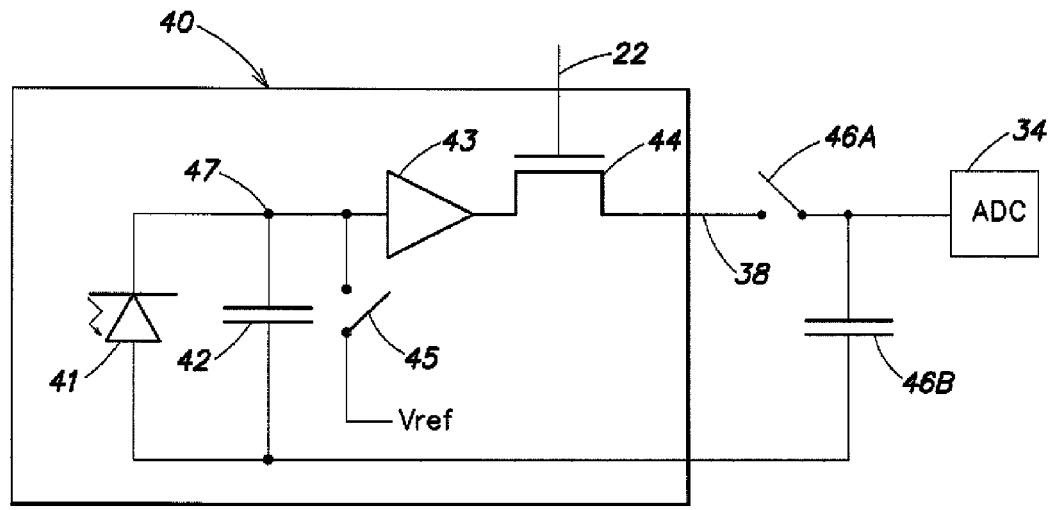
FIGS. 4A and 4B illustrate exemplary circuits within a pixel used to collect and amplify the charge received in each photodetector.

Referring to FIG. 4A, an exemplary pixel 40 is comprised of a germanium photodiode 41, an integration capacitor 42, an amplifier 43, a row selection transistor 44 which determines when the pixel is connected to the column bus 38, and a reset circuit 45. The integration capacitor 42 need not be a separate element, but may be constituted by the intrinsic capacitance of the photodetector and the amplifier input capacitance in parallel with other stray capacitances. Sample-and-hold circuits 46A or 46B in the column readout block (33 of FIG. 3) successively read each column of the array, and their outputs are digitized by the ADC 44.

At the start of each integration period, the pixel integration capacitor 42 is charged to a reference voltage by the reset switch 45. As light falls on the photodetector, current is generated, which discharges the capacitor 42. The floating node 47 of the capacitor is input to the amplifier 48. At the end of the integration period, the ROW select signal 22 is asserted, and the row transistor 44 puts the amplified output of the pixel on the COL bus 38, where it is read by the sample-and-hold circuit 46A, 46B in the column readout block. The pixel 40 is then reset and the next integration period begins.

Figure 4B:
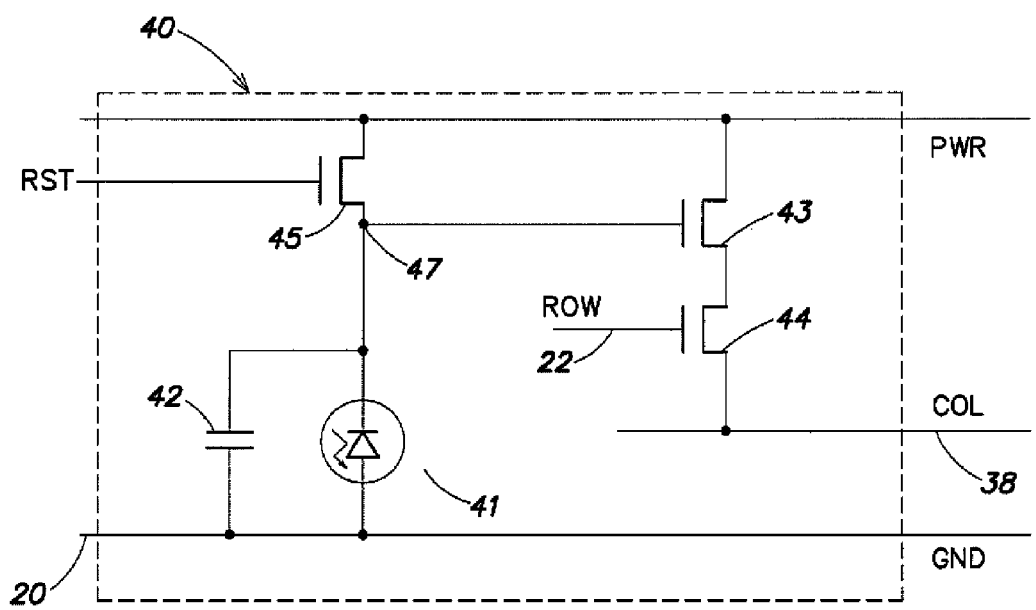

FIG. 4B is a more specific example of a FIG. 4A circuit. The reset circuit 45 is a single transistor and the amplifier 43 is a single-transistor source-follower circuit. The total pixel circuitry in this case is only three transistors.

Figure 5:
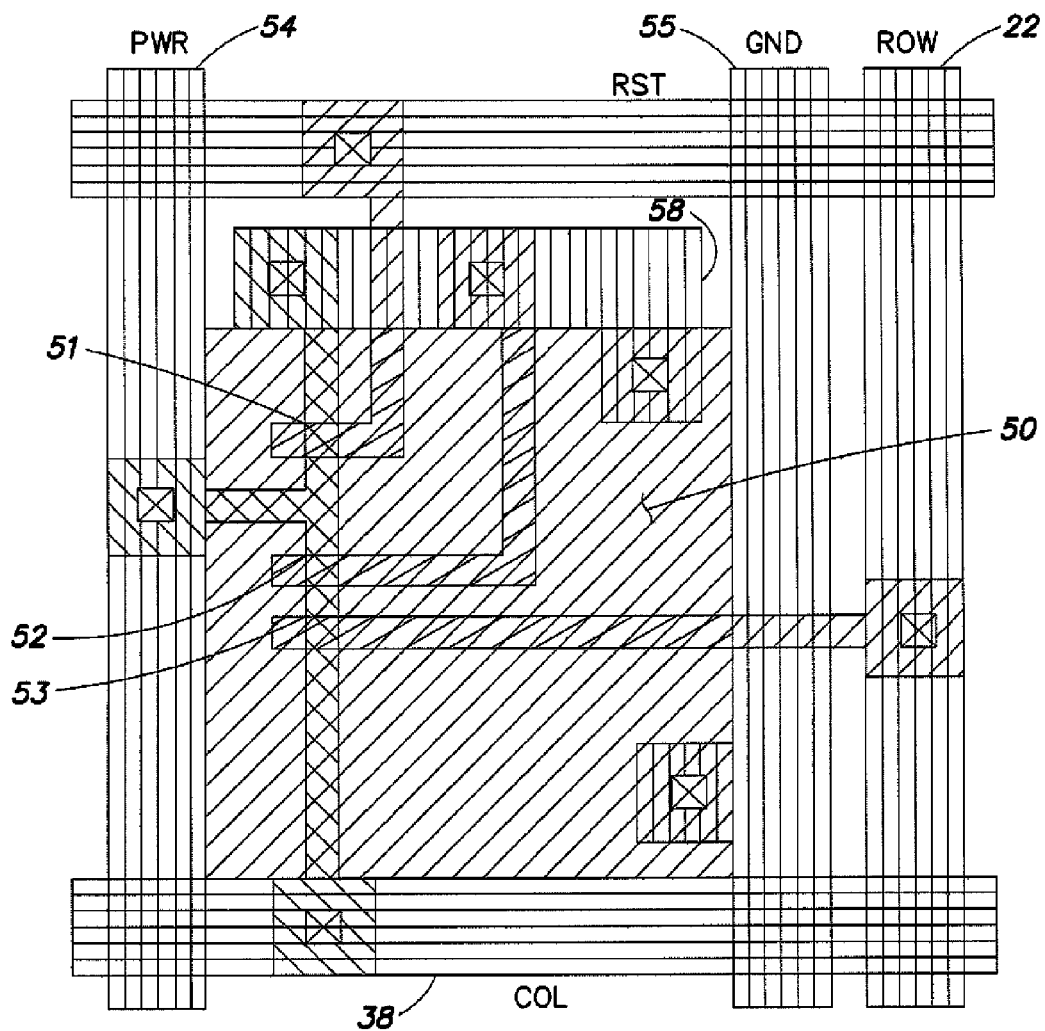
FIG. 5 shows the layout of a pixel that integrates the silicon circuit of FIG. 2 with a germanium photodetector.
Figure 6:
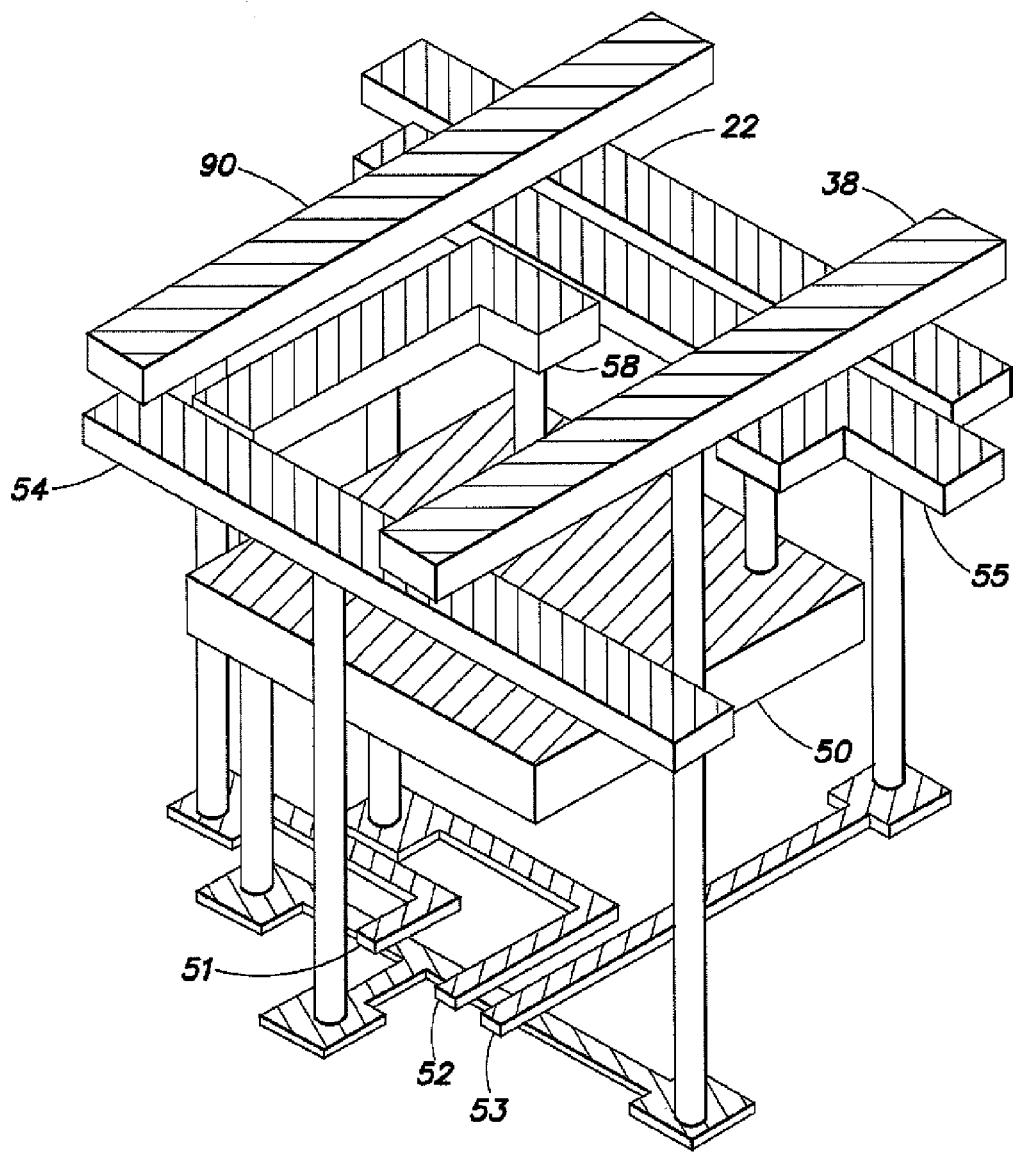
FIG. 6 is a three dimensional depiction of the pixel layout levels.

FIG. 5 shows that such a pixel can be laid out in a compact fashion, and FIG. 6 shows a three dimensional perspective view of the same pixel. The germanium layer 50 is the large element in the pixel, giving a high fill factor (i.e. a large percentage of the cell is responsive to illumination.) The reset transistor 51, the source follower transistor 52 and the row selection transistor 53 are formed in the silicon substrate underneath the germanium pixel. The power line 54 and the ground line 55 run parallel to the row select lines 22 on one level of metal, and the reset line 56 and column 38 line run perpendicular on a second metal level. The floating node 58 which constitutes one plate of the integration capacitor (42 of FIG. 4A) can be on either layer of metal, and is connected to the germanium element 50 as well as to the gate of the source follower transistor 52 and the source of the reset transistor 51. It will be appreciated by one skilled in the art that there are many other possible layouts of this basic pixel.

It will also be appreciated that many other integration circuits could be used to read the output of the germanium photodiode. For instance, high speed readout circuits could use transimpedance amplifiers with resistive or capacitative feedback to reduce readout noise. Noise reduction circuits may be added to reduce spatial and temporal noise. Circuits may be added to the pixels to minimize the effects of diode leakage current. In addition, a variety of readout architectures are possible, depending on the frame rate requirement of the intended application. Instead of a single ADC for the entire chip, a separate ADC might be placed at the bottom of each column, and all ADC conversions carried out in parallel. Alternatively, a sufficiently advanced silicon technology would allow the introduction of an ADC into each pixel. Thus a wide variety of array architectures can be used in the invention.

It will also be appreciated by one skilled in the art that a pixel with a number of junctions at different depths in the germanium pixel will allow the separate capture of photons of different wavelengths. Such pixels should also be considered within the scope of this invention.

Figure 7:
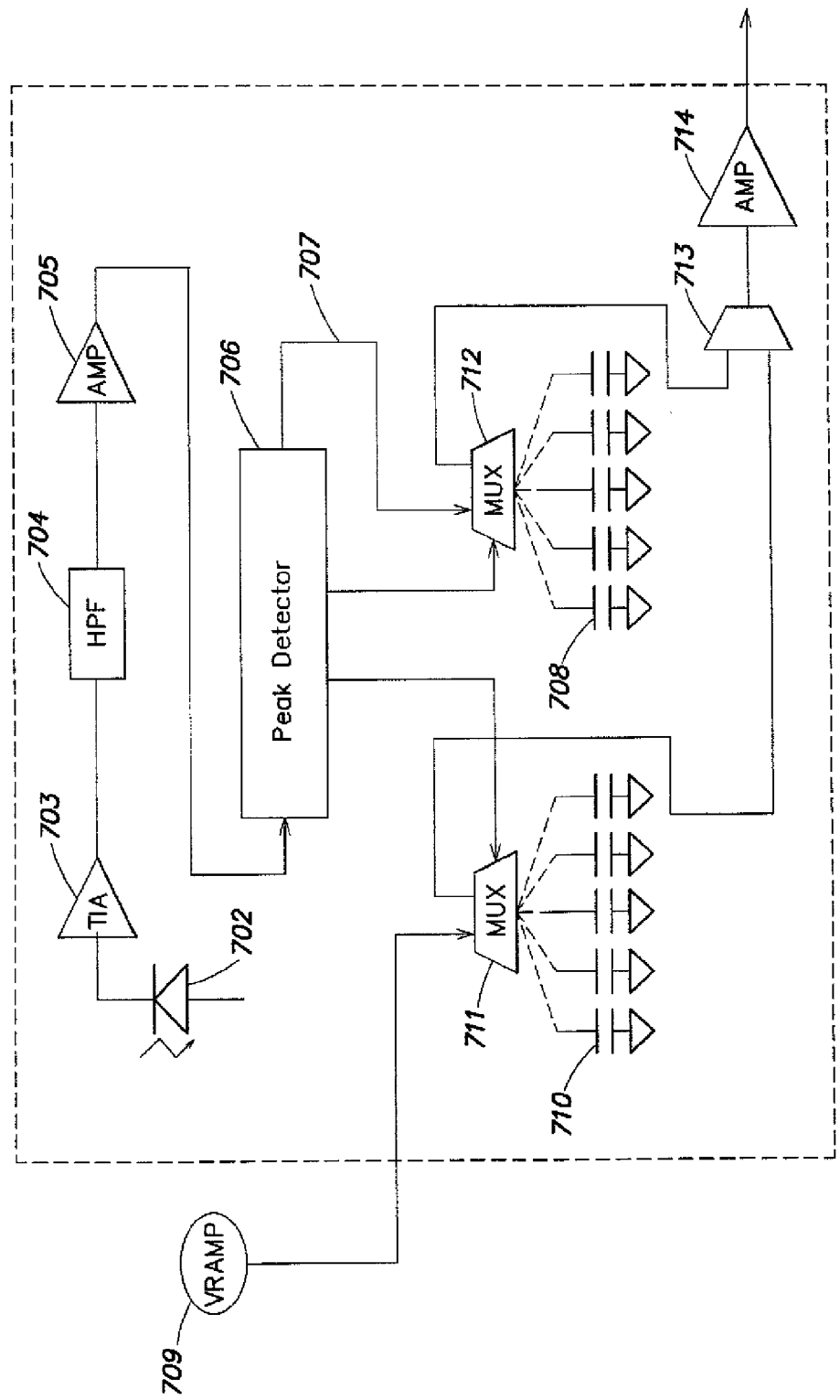
FIG. 7 illustrates an exemplary circuit in a pixel used to collect time-of-flight and intensity information.

FIG. 7 shows an alternative embodiment of a pixel array imager which is optimized for time-of-flight imaging. For this application, each pixel 701 measures not simply the total amount of illumination falling on the pixel, but the peaks of the illumination intensity and the times at which those peaks occur. The FIG. 7 imager can be used in a distance measuring camera, where the distance to remote objects is measured by illuminating the scene with a flash of infrared light, and the time at which reflections return to the camera directly measures the distance to each part of the scene.

The architecture of pixel 701 for this application is relatively sophisticated. The output of the photodiode 702 is fed into a fast low-noise amplifier 703. The amplified signal has DC and low-frequency components removed by the filter 704 before being further amplified by the amplifier 705 and entering the peak detector 706. The peak detector produces an output each time the incoming signal rises to a peak and then falls again, corresponding to reflections from objects more distant in the field of view of the pixel. At each peak, the intensity of the peak 707 is recorded on a storage capacitor 708, and the presence of the peak is used to switch an on-chip voltage ramp 709 between a plurality of storage capacitors 710. The voltage ramp 709 begins to rise when the flash is sent out. When the first storage capacitor 710 is disconnected, the value of the ramp is frozen on that capacitor and serves as a measure of the time at which the reflection arrived. By using the multiplexors 711 and 712, the arrival times and the peak intensities of a number of reflections from one part of the scene are recorded. After all reflections have returned, the voltages on the timing capacitors 710 and the intensity capacitors 708 are read out through the output multiplexor 713 and pixel output amplifier 714.

A number of variations on this circuit are possible. For instance, instead of a voltage ramp, a constant current source can be applied to the timing capacitors. The total charge collected on the time capacitors would be a measure of the time-of-flight. A single intensity capacitor and single timing capacitor can be used at each pixel if only a single pulse return is desired. The threshold used for peak detection can be varied adaptively with time. Alternatively a digital timing signal can be frozen on digital storage elements in each pixel. Thus the particular circuit given here by way of example should not be construed as limiting the scope of the invention.

An array of germanium photosensitive elements is thus integrated with silicon readout circuits to form an infrared imager. The silicon transistors are formed first, using silicon wafer fabrication techniques well known to those skilled in the art. The germanium elements are added in a subsequent step, and wafer fabrication techniques are applied to form germanium photodiodes. The temperatures needed for germanium processing are lower than those necessary for silicon processing, thus the germanium devices can be formed without affecting the previously formed silicon devices. Insulating and metallic layers are then deposited and patterned to form the circuit wiring and to connect the germanium devices to the silicon circuits. It can now be seen that one aspect of the invention is an image sensor comprising a plurality of photodetectors disposed on a substrate comprising silicon. The photodetectors include isolated islands comprising germanium. The islands are integrated with the silicon by epitaxial growth. The substrate includes integrated silicon circuitry connected to the photodetectors to individually address and read the photoresponses of the photodetectors. Preferably the substrate has an outer dielectric clad surface that includes openings. The isolated islands comprising germanium are disposed in the openings and integrated with the silicon by epitaxial growth. Advantageously the outer surface is planar, and the islands have outer surfaces co-planar with the silicon. For typical applications, the islands should have sufficient thickness to absorb the least 1% of the incident light in the wavelength range 400 to 1700 nanometers. The substrate and the islands are advantageously monocrystalline material and can be crystallographically aligned. One or more of the islands can include a plurality of p-n junctions at different respective depths in order to distinguish the spectrum of light absorbed by the island. Advantageously, the islands are formed by the process described in U.S. patent application Ser. No. 10/510,932.

Components of the integrated circuitry formed within the substrate can be connected together and connected to the photodetectors by a common metallization layer. The integrated circuitry can, for time-of-flight imaging, be configured to measure peaks in the incident light.

The advantages of the invention are manyfold. The advantages include the following:

A short wave infrared detector array on a silicon substrate with sensitivity to 1.7 μm The ability to form such an array with low dark current The ability to form such an array with high frequency response High quantum efficiency array by controlling well depth of individual detectors Germanium absorption layer lies above the substrate allowing transistors to occupy the underlying area thereby increasing the fill factor High uniformity across the array due to the use of well established Si processing techniques Low pixel cross talk since carrier diffusion between pixels is impossible High density and high speed transistors as well as other components can be integrated with the array Complete reuse of process models and standard cells due to modular integration Pixel size can be made extremely small thus reducing the resulting imager size for a given number of pixels, allowing smaller and lighter weight camera optics to be used Pixel size can be made extremely small thus allowing high resolution arrays for a given imager area Same metallization process used to contact Ge devices, Si devices, and passive components This technology takes advantage of silicon scaling rates by allowing an improvement in fill factor or an increase in electronic complexity as linewidths shrink. The pitch in hybridized arrays is substantially unchanged in the last decade.

Indium bump bond hybridization is not required thereby increasing reliability and yield Hybridization is not required therefore reducing cost Low capacitance connections from IR photodiode to circuit While the descriptions herein contain many specific descriptions, these should not be construed as limitations on the scope of the invention, but rather as examples of several preferred or advantageous embodiments. Accordingly, the scope of the invention should be determined not by the specific embodiments illustrated, but rather by the appended claims and their legal equivalents.

What is claimed is:

1. An image sensor comprising:
a plurality of photodetectors comprising at least a first photodetector and a second photodetector, each of the first and second photodetectors comprising an anode and a cathode and being disposed on a substrate comprising silicon;
the first photodetector comprising a first island comprising monocrystalline material comprising germanium;
the second photodetector comprising a second island comprising monocrystalline material comprising germanium;
wherein the first island and second island are integrated with the silicon; and
the substrate comprising integrated silicon circuitry connected to the plurality of photodetectors to individually address and read photoresponses of the plurality of photodetectors.

2. The image sensor of claim 1 wherein the substrate has an outer dielectric clad surface comprising a plurality of openings comprising at least a first opening and a second opening;
wherein the first island is disposed in the first opening and integrated with the silicon by epitaxial growth; and
wherein the second island is disposed in the second opening and integrated with the silicon by epitaxial growth.

3. The image sensor of claim 1 wherein the substrate has a planar outer surface comprising a plurality of openings comprising at least a first opening and a second opening;
wherein the first island is disposed in the first opening, is integrated with the silicon by epitaxial growth, and has an outer surface co-planar with the planar outer surface of the substrate; and
wherein the second island is disposed in the second opening, is integrated with the silicon by epitaxial growth, and has an outer surface co-planar with the planar outer surface of the substrate.

4. The image sensor of claim 1 wherein the first island and the second island each has sufficient thickness to absorb at least 1% of incident light in a wavelength range of 400 to 1700 nm.

5. The image sensor of claim 1 wherein the first island comprises a plurality of p-n junctions at different depths in order to distinguish a spectrum of light absorbed.

6. The image sensor of claim 1 wherein the substrate comprises monocrystalline material and wherein the monocrystalline material of the first island and the monocrystalline material of the second island are crystallographically aligned with the substrate monocrystalline material.

7. The image sensor of claim 1 wherein the first island is a germanium island.

8. The image sensor of claim 7, wherein the monocrystalline material of the first island has a defect density less than approximately $10^4$ defects/cm$^3$.

9. The image sensor of claim 7, wherein the monocrystalline material of the first island has a defect density less than approximately $10^3$ defects/cm$^3$.

10. The image sensor of claim 1 wherein the first island comprises an alloy containing silicon and germanium.

11. The image sensor of claim 1 wherein the integrated silicon circuitry is connected together and connected to the plurality of photodetectors by a common metallization layer.

12. The image sensor of claim 1 wherein the integrated silicon circuitry is configured to measure peaks for time-of-flight imaging.

13. The image sensor of claim 1, wherein the monocrystalline material of the first island has a defect density less than approximately $10^4$ defects/cm$^3$.

14. The image sensor of claim 1, wherein the monocrystalline material of the first island has a defect density less than approximately $10^3$ defects/cm$^3$.

15. The image sensor of claim 1, wherein the first island comprises:
a first planar surface configured to receive incident radiation, the first planar surface being disposed distal to and substantially parallel to a device surface of the substrate; and
a second planar surface substantially parallel to the first planar surface and disposed proximate to the device surface of the substrate;
wherein the integrated silicon circuitry comprises at least one transistor comprising a gate layer, the gate layer comprising:
a third planar surface being disposed distal to and substantially parallel to the device surface of the substrate; and
a fourth planar surface substantially parallel to the third planar surface and disposed proximate to the device surface of the substrate; and
wherein the second planar surface is disposed a first distance from the device surface of the substrate, the third planar surface is disposed a second distance from the device surface of the substrate, and wherein the first distance is greater than the second distance.

16. An image sensor comprising:
a plurality of photodetectors disposed on a substrate comprising silicon;
the photodetectors comprising islands comprising monocrystalline material comprising germanium, wherein the islands are integrated with the silicon;

the substrate comprising integrated silicon circuitry connected to the photodetectors to individually address and read the photoresponses of the photodetectors;

wherein the islands are formed by steps comprising:

a) forming a dielectric cladding region on a major surface of the substrate comprising silicon;

b) forming first openings that extend to a first depth within the cladding region;

c) forming a smaller second opening within each first opening, that extends to a second depth greater than the first depth and exposes the silicon;

d) epitaxially growing regions of a material comprising germanium on the silicon in each of the openings and on top of the cladding region;

e) controlling the dimensions of the second openings so that defects tend to be confined to a first epitaxial region grown within the second openings and to epitaxial regions overgrown on top of the cladding region, and so that a second region located within the first opening is essentially free of defects; and f) removing epitaxially overgrown regions that extend above the cladding region by a planarization process.

17. The image sensor of claim 16, wherein the monocrystalline material has a defect density less than approximately $10^4$ defects/cm$^3$.

18. The image sensor of claim 16, wherein the monocrystalline material has a defect density less than approximately $10^3$ defects/cm$^3$.

* * * * *